US009684027B2

United States Patent
Noguchi et al.

(10) Patent No.: US 9,684,027 B2
(45) Date of Patent: Jun. 20, 2017

(54) MEASURING APPARATUS

(71) Applicant: Mitsubishi Electric Corporation, Tokyo (JP)

(72) Inventors: Takaya Noguchi, Tokyo (JP); Akira Okada, Tokyo (JP); Takayuki Shirotori, Akita (JP)

(73) Assignee: Mitsubishi Electric Corporation, Tokyo (JP)

( * ) Notice: Subject to any disclaimer, the term of this patent is extended or adjusted under 35 U.S.C. 154(b) by 56 days.

(21) Appl. No.: 14/699,356

(22) Filed: Apr. 29, 2015

(65) Prior Publication Data
US 2015/0362549 A1    Dec. 17, 2015

(30) Foreign Application Priority Data

Jun. 11, 2014    (JP) ................................ 2014-120830

(51) Int. Cl.
*G01R 31/28*    (2006.01)
*G01R 31/12*    (2006.01)
(Continued)

(52) U.S. Cl.
CPC ....... *G01R 31/129* (2013.01); *G01R 31/2601* (2013.01); *G01R 31/2851* (2013.01); *G01R 31/14* (2013.01)

(58) Field of Classification Search
USPC .................... 324/452, 457, 750.01
See application file for complete search history.

(56) References Cited

U.S. PATENT DOCUMENTS

| 4,329,558 A | * | 5/1982 | Martin | ..................... B23H 7/04 219/69.12 |
| 4,691,089 A | * | 9/1987 | Balleys | ..................... B23H 7/04 219/69.12 |
| 2002/0121916 A1 | | 9/2002 | Toyoda | |

FOREIGN PATENT DOCUMENTS

| JP | H08-075818 A | 3/1996 |
| JP | 2002-257904 A | 9/2002 |

(Continued)

OTHER PUBLICATIONS

An Office Action issued by the Korean Patent Office on Oct. 19, 2016, which corresponds to Korean Patent Application No. 10-2015-0081667 and is related to U.S. Appl. No. 14/699,356; with English language translation.

(Continued)

*Primary Examiner* — Vincent Q Nguyen
(74) *Attorney, Agent, or Firm* — Studebaker & Brackett PC

(57) ABSTRACT

A measuring apparatus includes a measuring unit for measuring an electrical characteristic of a measurement object by applying an electrical signal, and a discharge detection unit connected to the measuring unit, the discharge detection unit obtaining an electrical signal value that is the value of the electrical signal applied to the measurement object, wherein if the electrical signal value is smaller than a predetermined reference value, the discharge detection unit issues a discharge alarm to the outside when a difference value between the electrical signal value and the reference value becomes larger than a predetermined first comparison value after the difference value becomes smaller than the first comparison value, and wherein the reference value is set equal to or larger than the maximum of the electrical signal value when no electric discharge occurs.

13 Claims, 8 Drawing Sheets

(51) Int. Cl.
    *G01R 31/26*    (2014.01)
    *G01R 31/14*    (2006.01)

(56) References Cited

FOREIGN PATENT DOCUMENTS

| | | |
|---|---|---|
| JP | 2003-130925 A | 5/2003 |
| JP | 2003-172757 A | 6/2003 |
| JP | 2007-225537 A | 9/2007 |
| JP | 2008-268084 A | 11/2008 |

OTHER PUBLICATIONS

An Office Action; "Notification of Reason for Rejection," issued by the Japanese Patent Office on Mar. 21, 2017, which corresponds to Japanese Patent Application No. 2014-120830 and is related to U.S. Appl. No. 14/699,356; with English language partial translation.
The Final Rejection issued by the Korean Patent Office on Apr. 20, 2017, which corresponds to Korean Patent Application No. 10-2015-0081667 and is related to U.S. Appl. No. 14/699,356; with English language partial translation.

\* cited by examiner

US 9,684,027 B2

MEASURING APPARATUS

BACKGROUND OF THE INVENTION

Field of the Invention

The present invention relates to a measuring apparatus for measuring an electrical characteristic of a measurement object.

Background Art

When a large current or a high voltage is applied to a measurement object for the purpose of measuring an electrical characteristic of the measurement object, there is a possibility of occurrence of electric discharge, for example, between a probe and the measurement object. The measurement object on which electric discharge has occurred during measurement is thought to have suffered certain damage. There is, therefore, a need to detect electric discharge with reliability. In a case where electric discharge is overlooked and the measurement object on which electric discharge has occurred outflows as a good article into a post-process, it is difficult to extract the measurement object in the post-process.

Japanese Patent Laid-Open No. 2003-130925 discloses a method of detecting electric discharge. In this electric discharge detection method, electric discharge that occurs in a semiconductor element module is determined from a discharge pulse current and sound detected with an acoustic emission sensor.

It is difficult to apply the technique disclosed in Japanese Patent Laid-Open No. 2003-130925 to measurement on a certain measurement object such as a wafer or a chip because of the detection through sound in the module. The technique also has a problem that it requires a certain degree of silence.

SUMMARY OF THE INVENTION

The present invention has been achieved to solve the above-described problems, and an object of the present invention is to provide a measuring apparatus capable of detecting in a simple way electric discharge that occurs when an electrical characteristic of a measurement object is measured.

The features and advantages of the present invention may be summarized as follows.

According to one aspect of the present invention, a measuring apparatus includes a measuring unit for measuring an electrical characteristic of a measurement object by applying an electrical signal, and a discharge detection unit connected to the measuring unit, the discharge detection unit obtaining an electrical signal value that is the value of the electrical signal applied to the measurement object, wherein if the electrical signal value is smaller than a predetermined reference value, the discharge detection unit issues a discharge alarm to the outside when a difference value between the electrical signal value and the reference value becomes larger than a predetermined first comparison value after the difference value becomes smaller than the first comparison value, wherein the reference value is set equal to or larger than the maximum of the electrical signal value when no electric discharge occurs, and wherein the measurement unit applies the electrical signal to the measurement object so that the electrical signal value is maximized when the measurement of the measurement object is ended.

According to another aspect of the present invention, a measuring apparatus includes a measuring unit for measuring an electrical characteristic of a measurement object by applying an electrical signal, and a discharge detection unit connected to the measuring unit, the discharge detection unit obtaining an electrical signal value that is the value of the electrical signal applied to the measurement object, wherein the discharge detection unit samples the electrical signal value with a predetermined period, computes a first threshold value determined by subtracting a predetermined first comparison value from the electrical signal value, and issues a discharge alarm to the outside when the latest electrical signal value becomes smaller than the first threshold value obtained by the immediately preceding sampling, and wherein the measuring unit applies the electrical signal to the measurement object so that the electrical signal value is maximized when the measurement of the measurement object is ended.

Other and further objects, features and advantages of the invention will appear more fully from the following description.

DETAILED DESCRIPTION OF THE PREFERRED EMBODIMENTS

Figure 1:
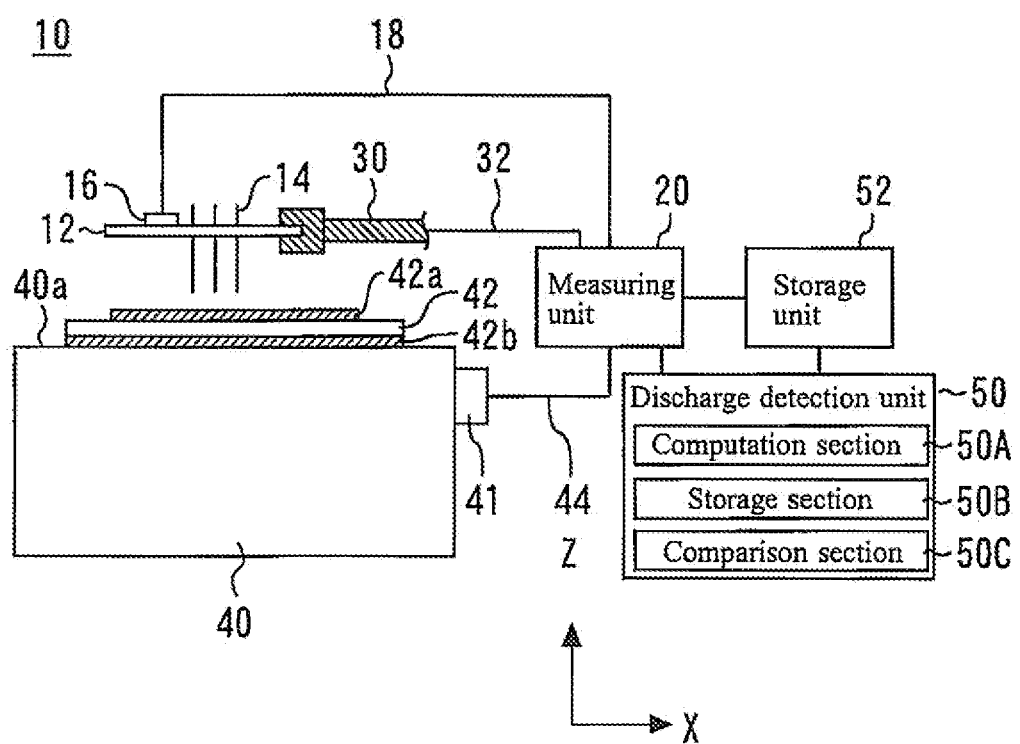
FIG. 1 is a measuring apparatus according to a first embodiment.

A measuring apparatus according to an embodiment of the present invention will be described with reference to the accompanying drawings. Components identical or corresponding to each other are indicated by the same reference characters, and a repeated description for them is avoided in some cases.

First Embodiment

FIG. 1 shows a measuring apparatus 10 according to a first embodiment of the present invention. The measuring apparatus 10 is provided with an insulating base plate 12 and a probe 14 fixed on the insulating base plate 12. The probe 14 is a portion electrically and mechanically connected to a measurement object. Preferably, the probe 14 is constructed so as to be extendable and contractible along a Z-direction, thereby reducing damage to the measurement object.

A spring-type probe, a multilayer probe, a wire probe or a cantilever probe may be used as probe 14. The probe 14 is formed of a metal, e.g., copper, tungsten or rhenium tungsten. A tip portion of the probe 14 may be coated with gold, palladium, tantalum or platinum for example to improve the durability of the probe 14. When wire bonding is performed on the measurement object, there is no need for the probe 14 because electrical connections to the measurement object are secured through external terminals (e.g., lead-frame-type or case-type external terminals).

A connection part 16 electrically connected to the probe 14 is provided on an upper surface of the insulating base plate 12. The probe 14 and the connection part 16 are connected to each other, for example, by a metal plate on the upper surface of the insulating base plate 12. The connection part 16 is connected to a measuring unit 20 by a signal line 18. The measuring unit 20 is a section for measuring an electrical characteristic of the measurement object by applying an electrical signal to the measurement object.

The insulating base plate 12 is supported by an arm 30. The arm 30 is connected to the measuring unit 20 through a signal line 32. With the arm 30 controlled by the measuring unit 20, the insulating base plate 12 is moved to an arbitrary position. A stage 40 that holds the measurement object by vacuum attraction or electrostatic attraction is provided below the insulating base plate 12 (in the minus Z-direction). A connection part 41 electrically connected to the vacuum attraction stage 40 is provided on a side surface of the stage 40. The connection part 41 is connected to the measuring unit 20 by a signal line 44.

FIG. 1 illustrates a measurement object 42 attracted to the stage 40 by vacuum attraction or electrostatic attraction. The measurement object 42 is a vertical semiconductor element having an upper surface electrode 42a and a lower surface electrode 42b and having a current caused to flow between these electrodes. The measurement object 42 is, for example, an insulated gate bipolar transistor (IGBT). The measurement object 42 is not limited to the vertical semiconductor element. The measurement object 42 may be a lateral semiconductor device having a current input or output through its particular surface.

When an electrical characteristic of the measurement object 42 is measured, a plurality of probes 14 are brought into contact with the upper surface electrode 42a by using the arm 30 in a state where the stage 40 and the lower surface electrode 42b are in contact with each other. The arrangement may alternatively be such that the insulating base plate 12 is fixed and the stage 40 is brought closer to the insulating base plate 12 so that the probe 14 and the upper surface electrode 42a are brought into contact with each other.

It is preferable that the lengths of a plurality of current paths from the connection part 16 to the connection part 41 via the probes 14 be made substantially equal to each other so that the magnitudes of currents flowing through the probes 14 are substantially equal to each other. In the first embodiment of the present invention, therefore, the plurality of probes 14 are provided between the connection part 16 and the connection part 41.

A discharge detection unit 50 is connected to the measuring unit 20. The discharge detection unit 50 is a section that detects, for example, electric discharge that can occur during measurement on the measurement object 42. The discharge detection unit 50 obtains from the measuring unit 20 an electrical signal value that is the value of an electrical signal applied to the measurement object 42.

The discharge detection unit 50 has a difference value computation section 50A, a comparison value storage section 50B and a comparison section 50C. The difference value computation section 50A computes a difference value that is the difference between the electrical signal value and a predetermined reference value. A first comparison value and a second comparison value are stored in the comparison value storage section 50B. The first comparison value and the second comparison value are indices for detection of electric discharge for example. The first comparison value and the second comparison value may be absolute values in computational processing. The comparison section 50C compares the difference value calculated in the difference value computation section 50A with the first comparison value (or the second comparison value).

Figure 2:
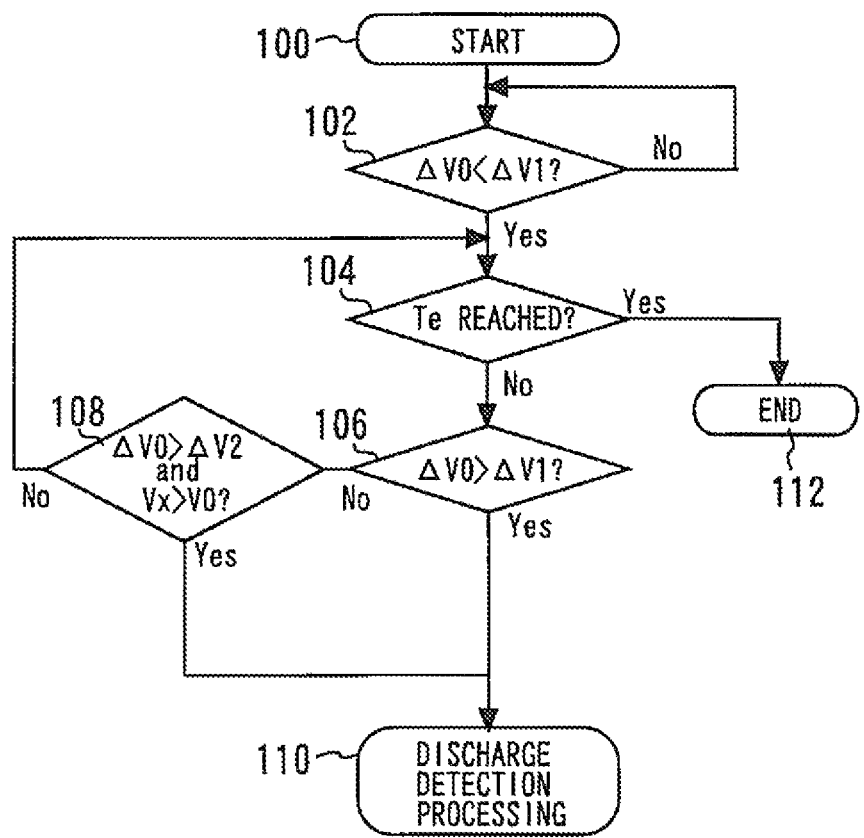
FIG. 2 is a flowchart showing the operation of the discharge detection unit.
Figure 3:
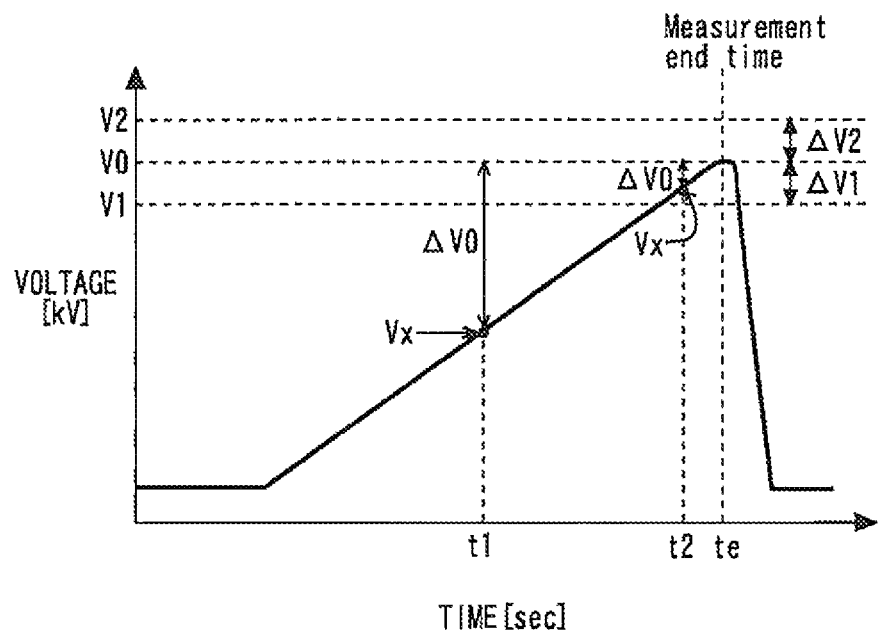
FIG. 3 is a diagram showing changes in an electrical signal value.

FIG. 2 is a flowchart showing the operation of the discharge detection unit 50. FIG. 3 is a diagram showing changes in an electrical signal value when the desired measurement is performed while no such abnormality as electric discharge occurs. The electrical signal value Vx is a "voltage" applied to the measurement object 42.

The operation of the discharge detection unit 50 when no such abnormality as electric discharge occurs will be described with reference to FIGS. 2 and 3. First, when the measuring unit 20 starts measurement on the measurement object 42 by monotonously increasing the electrical signal applied to the measurement object 42, the discharge detection unit 50 starts operating (step 100).

In step 102, the difference value computation section 50A computes a difference value $\Delta V0$ as the difference between the electrical signal value Vx and the reference value V0. The reference value V0 is set equal to or higher than the maximum of the electrical signal value when no electric discharge occurs. In this embodiment, the reference value V0 and the maximum of the electrical signal value (e.g., several kilovolts) are set equal to each other. It is preferable that the reference value V0 can be set by the user. The set reference value V0 is stored in the discharge detection unit 50.

Further, in step 102, the difference value $\Delta V0$ and the first comparison value $\Delta V1$ are compared with each other in the comparison section 50C. The difference value $\Delta V0$ is obtained from the difference value computation section 50A, while the first comparison value $\Delta V1$ is obtained from the comparison value storage section 50B. The first comparison value $\Delta V1$ is the value of the difference between the reference value V0 and a first threshold value V1. The first comparison value $\Delta V1$ is stored in advance in the comparison value storage section 50B, as described above. The difference value $\Delta V0$ is larger than the first comparison value $\Delta V1$ at time t1 for example. Then step 102 is again executed by suitable timing.

With a passage of time, the difference value $\Delta V0$ becomes smaller than the first comparison value $\Delta V1$ at time t2. In this case, the process advances to step 104. In step 104, determination is made as to whether or not a measurement end time te has been reached. Measurement end time te is not reached at tie t2 for example. Then the process advances to step 106.

In step 106, determination is made as to whether or not the electrical signal value Vx has been abruptly reduced by electric discharge. More specifically, determination is made as to whether or not the difference value $\Delta V0$ has been increased beyond the first comparison value $\Delta V1$ by an abrupt reduction in electrical signal value Vx caused by electric discharge. Since description is made here by assuming that no electric discharge occurs, $\Delta V0 > \Delta V1$ is not satisfied during the time period from time t2 to measurement end time te. The process therefore moves to step 108.

In step 108, determination is made as to whether or not an abrupt increase in electrical signal value has occurred. An abrupt increase in electrical signal value can occur, for example, when an abnormality occurs in the measuring unit 20 or when a bonding wire on the measurement object 42 is separated. In step 108, the comparison section 50C determines whether or not the electrical signal value Vx is larger than the reference value V0 and the difference value $\Delta V0$ is larger than the second comparison value $\Delta V2$. The difference value $\Delta V0$ is obtained from the difference value computation section 50A, while the second comparison value $\Delta V2$ is obtained from the comparison value storage section 50B. The second comparison value $\Delta V2$ is the value of the difference between the reference value V0 and a second threshold value V2. The second comparison value $\Delta V2$ is stored in advance in the comparison value storage section 50B, as described above. Since description is made here by assuming that no electric discharge occurs, the process moves to step 104.

Steps 104, 106, and 108 are repeated till measurement end time te and the process ends at measurement end time te (step 112). After the completion of measurement, the electrical signal value is abruptly reduced.

Figure 4:
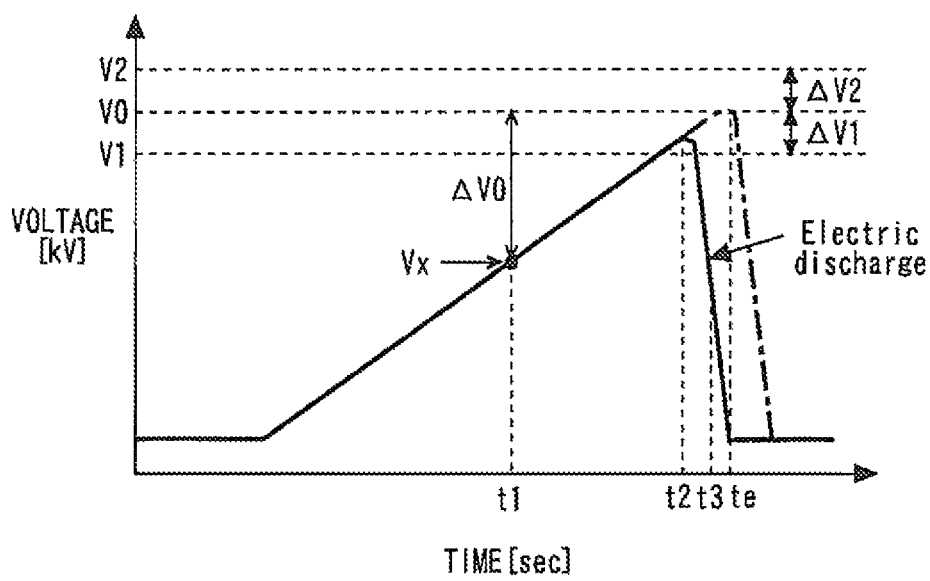
FIG. 4 is a diagram showing changes in electrical signal value.

The operation of the discharge detection unit 50 when electric discharge occurs will be described with reference to FIGS. 2 and 4. FIG. 4 is a diagram showing changes in electrical signal value when the electrical signal value is abruptly reduced by electric discharge. FIG. 4 shows an abrupt reduction in electrical signal value Vx due to electric discharge caused in the course of application of the electrical signal (at time t3) in an attempt to apply the electrical signal to the measurement object by monotonously increasing the electrical signal value Vx from the beginning of measurement to measurement end time te. In some cases, the electrical signal is abruptly reduced and is thereafter restored to the value immediately before the abrupt reduction. FIG. 4, however, shows a case where the electrical signal is abruptly reduced but not restored to the value immediately before the abrupt reduction. The dot-dash line in FIG. 4 indicates changes in electrical signal value in the case where no electric discharge occurs.

At time t3, an abrupt reduction in electrical signal value Vx occurs due to electric discharge. The difference value $\Delta V0$ therefore increases abruptly. It is determined in step 106 that the difference value $\Delta V0$ is larger than the first comparison value $\Delta V1$, and the process advances to step 110. In step 110, the discharge detection unit 50 issues a discharge alarm to the outside (measuring unit 20). When the discharge alarm is issued, discharge detection processing is executed.

Discharge detection processing includes measurement stop processing and information storage processing. Measurement stop processing is processing performed by the measuring unit 20 receiving the discharge alarm to stop (discontinue) measuring the measurement object 42. Upon receiving the discharge alarm, the measuring unit 20 immediately stops measuring, thus preventing damage to the probe 14 and the upper surface electrode 42a and limiting the expansion of damage to the measurement object 42 due to electric discharge.

Information storage processing is processing for storing, in a storage unit 52 connected to the discharge detection unit 50, information for identification of the measurement object on which electric discharge has occurred. For example, an ID number of the measurement object is stored. If the measurement object is a semiconductor wafer having a multiplicity of chips, information on the position of any one of the chips on which electric discharge has occurred is stored in the storage unit 52. The chip on which electric discharge has occurred is discarded.

As described above, electric discharge can be detected by issuing a discharge alarm when the difference value $\Delta V0$ becomes larger than the first comparison value $\Delta V1$ after the difference value $\Delta V0$ has become smaller than the first comparison value $\Delta V1$.

Figure 5:
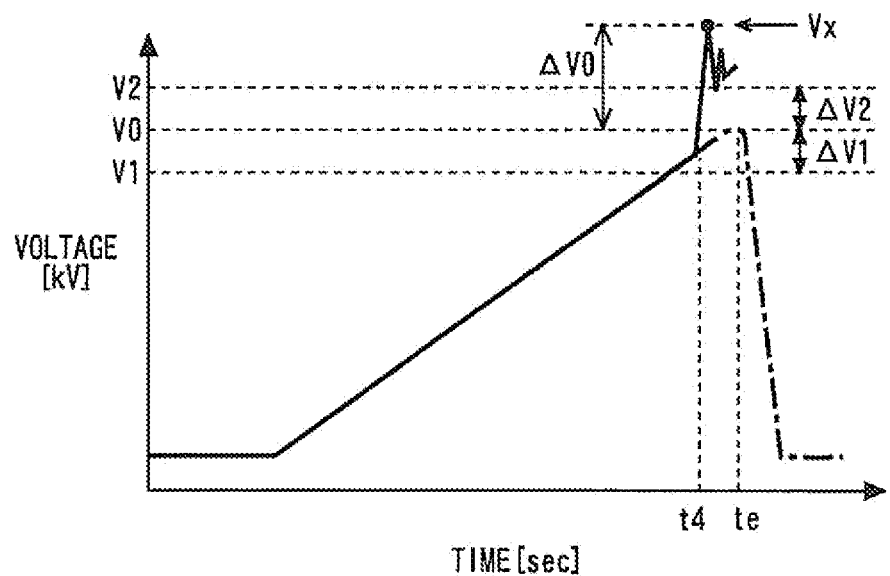
FIG. 5 is a diagram showing changes in electrical signal value.

The operation of the discharge detection unit 50 when the electrical signal value increases abruptly will be described with reference to FIGS. 2 and 5. FIG. 5 is a diagram showing changes in electrical signal value when the electrical signal value increases abruptly. The electrical signal value Vx increases abruptly at time t4. In step 108, therefore, it is determined that the electrical signal value Vx is larger than the reference value V0, and that the difference value $\Delta V0$ is larger than the second comparison value $\Delta V2$. An abnormality alarm is then issued in step 110 and the same processing as that in the above-described discharge detection processing is executed. That is, the measuring unit 20 stops measuring the measurement object 42 and information for identification of the measurement object from which the abrupt increase in electrical signal value has been detected is stored in the storage unit 52. Preferably, information on the kind of alarm is stored in the storage unit 52 by being associated with the measurement object in order to enable discrimination between issue of the abnormality alarm with respect to the measurement object recorded in the storage unit 52 and issue of the discharge alarm with respect to the measurement object.

Thus, in the measuring apparatus 10 according to the first embodiment of the present invention, electric discharge for example is detected by comparing the difference value $\Delta V0$ and the first comparison value $\Delta V1$ or the second comparison value $\Delta V2$ in the discharge detection unit 50. Since the measuring apparatus 10 can be made by only connecting the discharge detection unit 50 to the measuring unit 20, electric discharge for example, which occurs during measurement of an electrical characteristic of a measurement object, can be detected in a simple way.

Since the first comparison value $\Delta V1$ and the second comparison value $\Delta V2$ are stored in the comparison value storage section 50B, there is no need for any user operation to set these values. When the reference value is changed in the case where the first comparison value $\Delta V1$ and the second comparison value $\Delta V2$ are used in the comparison section 50C, there is a need to set the first comparison value $\Delta V1$ and the second comparison value $\Delta V2$ matching the changed reference value and there is a certain possibility of an error in operation. In the first embodiment of the present invention, however, errors in operation can be prevented since changing only the reference value suffices at the time of changing the reference value.

A case where a current flowing through a measurement object is used and a case where a voltage applied to a measurement object is used are conceivable as the electrical signal value. In a case where a current is used as the electrical signal value, there is a difficulty in detecting electric discharge, for example, because the original current value is restored immediately after a sporadic occurrence of electric discharge, and because the current value at the occurrence of electric discharge cannot be determined under the influence of an impedance.

On the other hand, in a case where a voltage applied to a measurement object is used as the electrical signal value, the original voltage value is restored after the completion of charging the circuit constituted of a power supply, a circuit impedance and the measurement object after a sporadic occurrence of electric discharge. That is, since it takes time to perform the above-described charging, an abrupt reduction in voltage value due to electric discharge continues for a certain time period. Therefore, the discharge detection accuracy when a voltage is used as the electrical signal value can be improved relative to that when a current is used as the electrical signal value. Since a voltage is used as the electrical signal value in the present invention, the discharge detection accuracy can be improved.

Step 108 is basically irrelevant to detection of electric discharge. Moreover, the frequency with which an abrupt increase in electrical signal value occurs is extremely low. Therefore, step 108 in FIG. 2 may be removed. If step 108 is removed, there is no need to store the second comparison value $\Delta V2$ in the comparison value storage section 50B.

Discharge detection processing is not limited to measurement stop processing and information storage processing. Discharge detection processing may include, for example, notification to the user by means of sound. The above-described examples of modifications can also be applied to measuring apparatus according to embodiments described below. The measuring apparatus according to embodiments described below have number of commonalities with the first embodiment and will therefore be descried mainly with respect to differences from the first embodiment.

Second Embodiment

Figure 6:
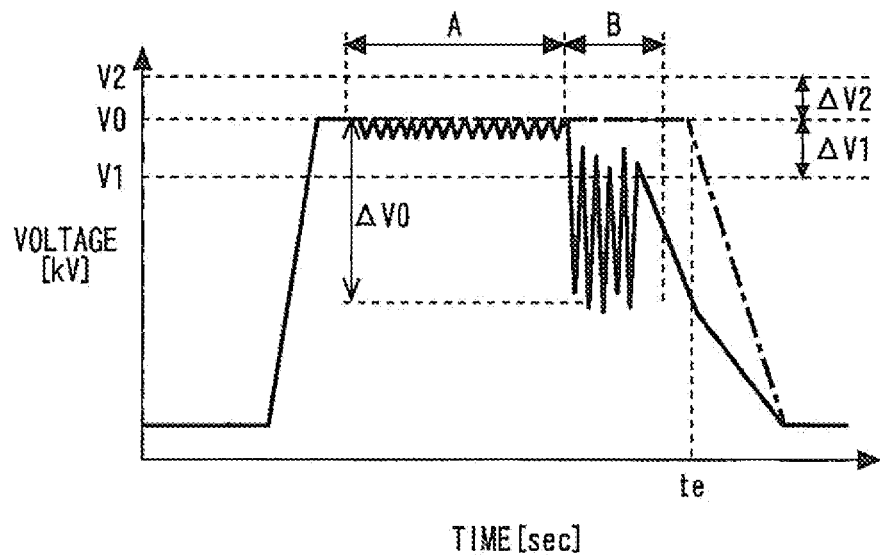
FIG. 6 is a diagram showing occurrence of oscillation and electric discharge.

In a second embodiment of the present invention, the measuring unit applies a rectangular pulse as an electrical signal to a measurement object. FIG. 6 is a diagram showing occurrence of oscillation and electric discharge in an attempt to apply a rectangular pulse to a measurement object. In a time period A, fluctuation in the electrical signal value due to oscillation is observed. This oscillation is not electric discharge but a phenomenon due to a characteristic of the measurement object or the measurement circuit. Therefore, the first comparison value $\Delta V1$ and the second comparison value $\Delta V2$ are set larger than the domain of the oscillation in order that the difference value $\Delta V0$ in the time period A be not larger than the first comparison value $\Delta V1$ or the second comparison value $\Delta V2$.

In a time period B, continuous discharge occurs and the electrical signal value is abruptly reduced. In this case, the difference value $\Delta V0$ becomes larger than the first comparison value $\Delta V1$, the process therefore advances from step 106 to step 110 and the discharge alarm is issued. The dot-dash line in FIG. 6 indicates changes in electrical signal value in the case where no electric discharge occurs.

In the first embodiment, the electrical signal value is monotonously increased. In the second embodiment, a rectangular pulse is used as an electrical signal. However, as long as the electrical signal is applied to the measurement object so that the electrical signal value is maximized at the end of measurement on the measurement object, the waveform of the electrical signal is not particularly restricted. That is, when the electrical signal value is intentionally reduced during measurement, an abrupt reduction in electrical signal value due to electric discharge and the reduction in electrical signal value intentionally caused cannot be discriminated from each other. Therefore, the discharge detection units in the first and second embodiments are effective in a sort of measurement in which the electrical signal value is maintained or increased, and are not used in a sort of measurement in which the electrical signal value is reduced.

Third Embodiment

Figure 7:
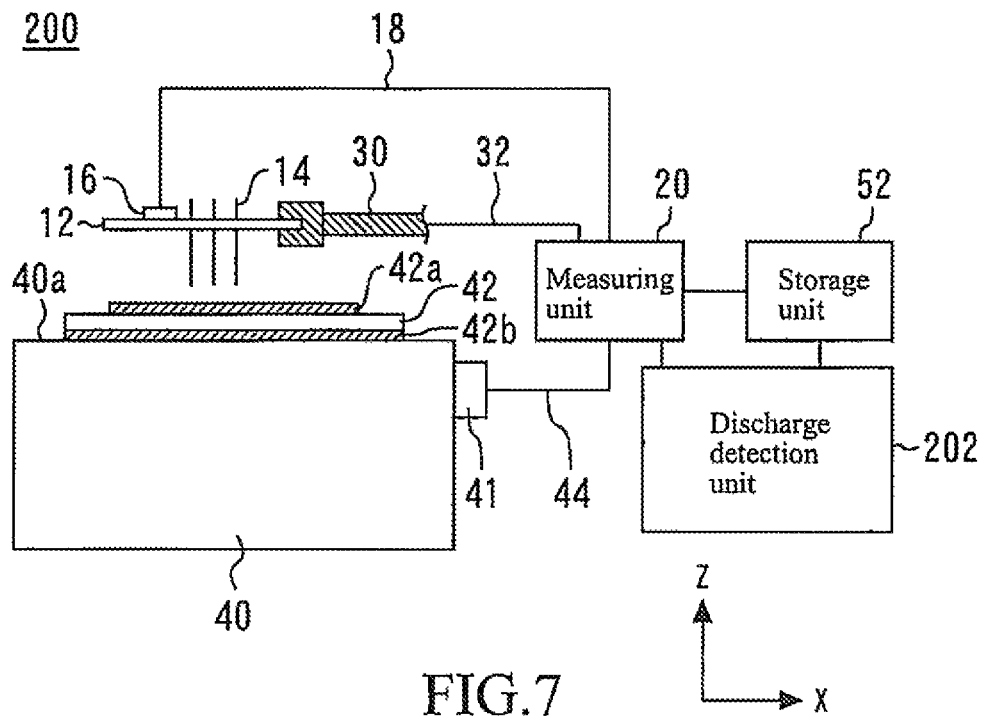
FIG. 7 is diagram showing a measuring apparatus according to the third embodiment.

In a third embodiment of the present invention, the reference value is made to follow an electrical signal value during measurement of an electrical characteristic of a measurement object. That is, the reference value changes with respect to time. FIG. 7 is a diagram showing a measuring apparatus 200 according to the third embodiment of the present invention. A discharge detection unit 202 is connected to the measuring unit 20 and obtains an electrical signal value (voltage) that is the value of an electrical signal applied to a measurement object 42.

The discharge detection unit 202 samples the electrical signal value with a predetermined sampling period. The sampling period is, for example, about several microseconds to several ten microseconds. The discharge detection unit 202 computes a first threshold value that is a value determined by subtracting a predetermined first comparison value from the electrical signal value obtained. The first threshold value is computed with respect to each sampling period. The discharge detection unit 202 issues a discharge alarm when the latest electrical signal value is smaller than the first threshold value obtained by the immediately preceding sampling.

Figure 8:
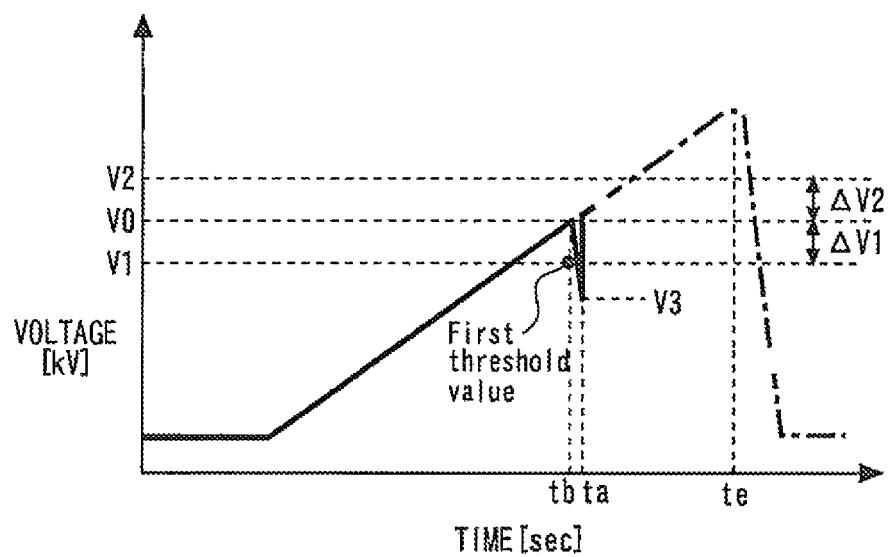
FIG. 8 is a diagram showing an abrupt reduction in electrical signal value.

The operation of the discharge detection unit 202 will be described with reference to FIGS. 8 to 10. FIG. 8 is a diagram showing an abrupt reduction in electrical signal value due to electric discharge. Electric discharge occurs at time ta. The electrical signal value sampled at this time is V3. The time at which (immediately preceding) sampling is performed immediately before the occurrence of electric discharge is time tb. The electrical signal value at time tb is assumed to be a reference value V0 at time tb. A first threshold value V1 determined by subtracting a first comparison value $\Delta V1$ from the electrical signal value (reference value V0) at time tb is indicated by a black round mark. Since the latest electrical signal value V3 is smaller than the first threshold value V1 obtained by the immediately preceding sampling, the discharge detection unit 202 issues the discharge alarm. Processing after the detection of electric discharge is the same as that in the first embodiment.

Figure 9:
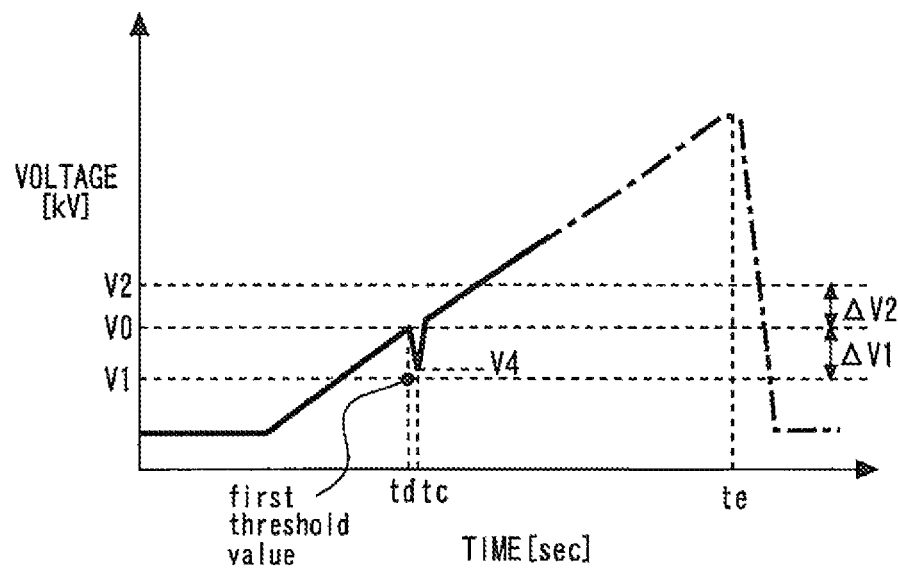
FIG. 9 is a diagram showing an occurrence of temporary oscillation of the electrical signal value.

FIG. 9 is a diagram showing an occurrence of temporary oscillation of the electrical signal value. Oscillation occurs at time tc. The electrical signal value sampled at this time is V4. The time at which (immediately preceding) sampling is performed immediately before the occurrence of oscillation is time td. The electrical signal value at time td is assumed to be the reference value V0 at time td. The first threshold value V1 determined by subtracting the first comparison value $\Delta V1$ from the electrical signal value (reference value V0) at time td is indicated by a black round mark. Since the latest electrical signal value V4 is larger than the first threshold value V1 obtained by the immediately preceding sampling, the discharge alarm is not issued. Thus, detecting as electric discharge a reduction in electrical signal value due to oscillation is avoided.

Figure 10:
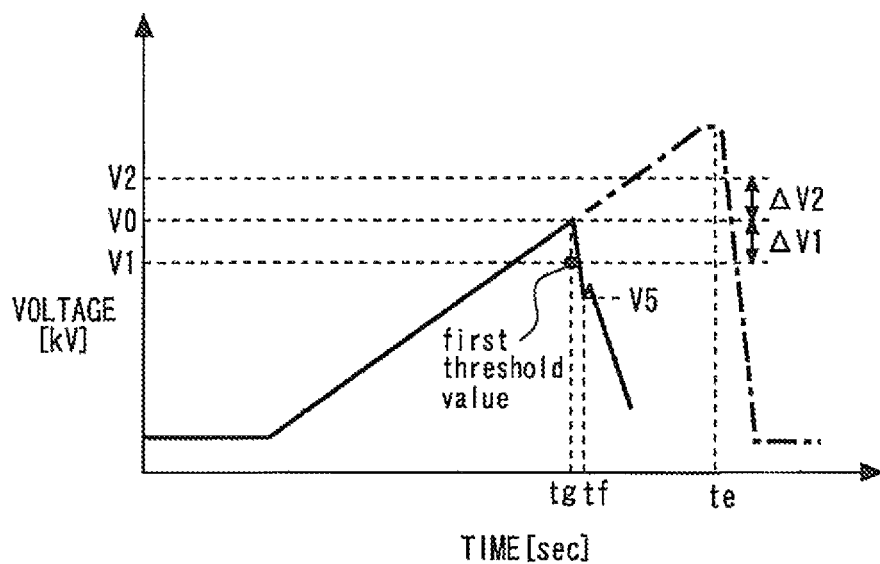
FIG. 10 is a diagram showing a state where after the electrical signal value is abruptly reduced, the electrical signal value is not restored.

FIG. 10 is a diagram showing a state where after the electrical signal value is abruptly reduced by continuous electric discharge, the electrical signal value is not restored. In this case, the latest electrical signal value V5 (at time tf) is smaller than the first threshold value V1 obtained by the immediately preceding sampling (at time tg) and, therefore, the discharge alarm is issued, as in the case shown in FIG. 8.

An abrupt increase in electrical signal value is not necessarily detected, as described above in the description of the first embodiment. In a case where an abrupt increase in electrical signal value is detected, the abnormality alarm is issued when the latest electrical signal value becomes larger than a second threshold value V2 obtained by the immediately preceding sampling. The second threshold value V2 is a value determined by adding a predetermined second comparison value to the electrical signal value.

With the measuring apparatus according to the first or second embodiment, electric discharge detection cannot be performed over the entire measurement period because the reference value is fixed. Therefore, assuring that no electric discharge occurs over the entire measurement period requires a checking step for checking whether or not there is a damage or the like due to electric discharge after the measurement.

In the third embodiment according to the present invention, however, the reference value and the first threshold value computed from the reference value are changed with respect to time since the electrical signal value is used as a reference value. Therefore, electric discharge detection can be performed over the entire measurement period. Thus, it is possible to assure that no electric discharge occurs over the entire measurement period while there is no need for the checking step.

Figure 11:
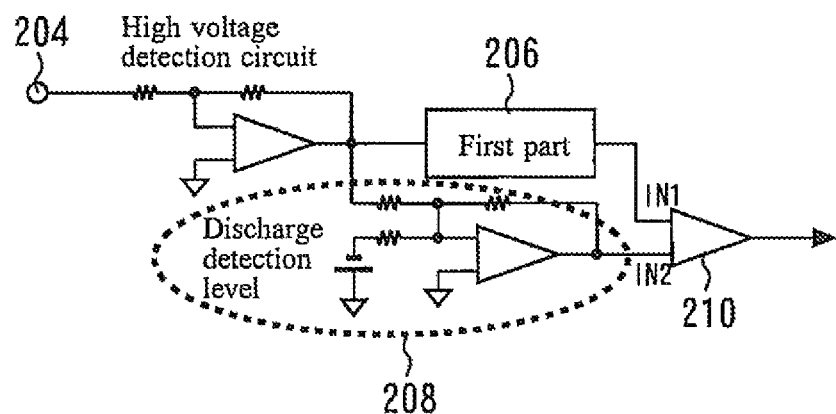
FIG. 11 is a diagram showing a discharge detection unit constituted by an analog circuit.

The discharge detection unit 202 may be constituted by an analog circuit or a digital circuit. FIG. 11 is a diagram showing a discharge detection unit constituted by an analog circuit. An input portion 204 is a portion to which the electrical signal value is input from the measuring unit 20. A first part 206 outputs the first threshold value obtained by the immediately preceding sampling. A second part 208 outputs the latest electrical signal value. A comparator 210 is supplied with an output from the first part 206 and an output from the second part 208. The comparator 210 issues the discharge alarm (high level signal) when the value of the output from the second part 208 (IN2) becomes smaller than the value of the output from the first part 206 (IN1).

Figure 12:
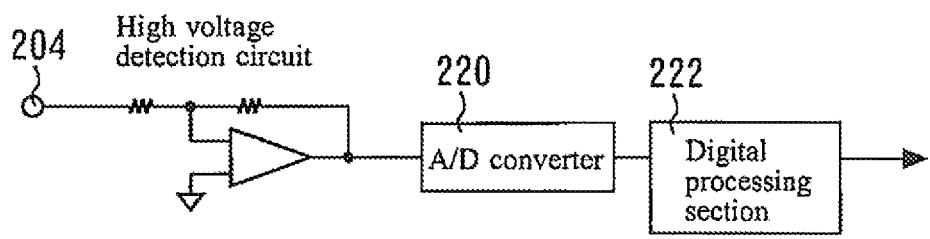
FIG. 12 is a diagram showing a discharge detection unit constituted by a digital circuit.

FIG. 12 is a diagram showing a discharge detection unit constituted by a digital circuit. An A/D converter 220 converts the electrical signal value into a digital value and outputs the digital value. A digital processing section 222 computes the first threshold value from the digitally converted electrical signal value and issues the discharge alarm when the latest electrical signal value becomes smaller than the first threshold value obtained by the immediately preceding sampling.

In measurement by maintaining or increasing the electrical signal value with passage of time, the electrical signal value is reduced, for example, when electric discharge or short circuit in the measurement object occurs. Therefore, the first part 206 shown in FIG. 11 may be replaced with a maximum voltage output section that outputs the maximum electrical signal value (maximum voltage value) in the period from the beginning of measurement to the latest sampling time. When the electrical signal value is abruptly reduced by electric discharge, the latest electrical signal value becomes smaller than the maximum voltage value. At this time, the comparator 210 issues the discharge alarm. The maximum voltage output section can be simpler in construction than the first part 206 since there is no need for the computation performed in the first part 206. If oscillation occurs causing a small reduction in electrical signal value during measurement, the oscillation is detected as electric discharge. In such a case, therefore, the maximum voltage output section cannot be used.

Fourth Embodiment

Figure 13:
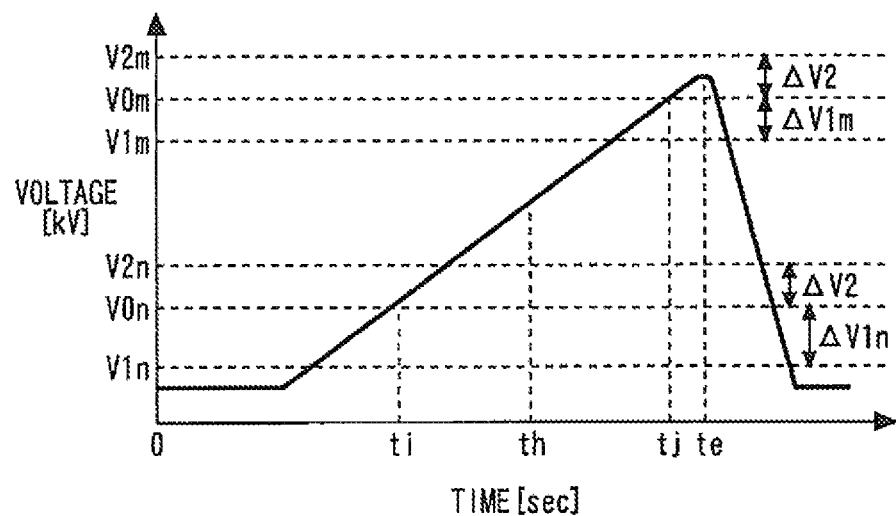
FIG. 13 is a diagram showing change of the first comparison value during measurement.

Electric discharge detection according to a fourth embodiment of the present invention is basically the same as that in the third embodiment but differs from that in the third embodiment in that the first comparison value is changed in the course of measurement. FIG. 13 is a diagram showing change of the first comparison value during measurement. Before time th, a first comparison value $\Delta V1n$ is used. At time ti for example, a first threshold value $V1n$ that is a value determined by subtracting the first comparison value $\Delta V1n$ from an electrical signal value $V0n$ is computed. The latest electrical signal value obtained by subsequent sampling after time ti is compared with the first threshold value $V1n$.

At or after time th, a first comparison value $\Delta V1m$ is used. The first comparison value $\Delta V1m$ is smaller than the first comparison value $\Delta V1n$. At time tj for example, a first threshold value $V1m$ that is a value determined by subtracting the first comparison value $\Delta V1m$ from an electrical signal value $V0m$ is computed. The latest electrical signal value obtained by subsequent sampling after time tj is compared with the first threshold value $V1m$.

There is a possibility of oscillation of the electrical signal value due to an electrical characteristic of a measurement object or the configuration of the measurement circuit for example. It is preferable to increase the first comparison value in the time period in which oscillation can occur in order to avoid detecting oscillation of the electrical signal value as electric discharge.

In the fourth embodiment of the present invention, a case where oscillation can occur easily in the period before time th is assumed and the first comparison value $\Delta V1n$ in the period before time th is increased relative to the first comparison value $\Delta V1m$ at or after time th. It is, therefore, possible to reliably detecting electrical discharge by using the smaller first comparison value in the period after time th in which oscillation does not occur, while avoiding detecting oscillation that occurs in the period before time th as electric discharge.

In the fourth embodiment of the present invention, the larger first comparison value $\Delta V1n$ is first used and the smaller first comparison value $\Delta V1m$ is thereafter used. However, the first comparison value may be changed by a different method. Preferably, the first comparison value is increased in a period in which oscillation can occur easily, and the first comparison value is reduced in other periods. In a case where oscillation cannot occur easily at an initial stage of measurement and oscillation can occur easily in at a later stage of measurement, therefore, a smaller first comparison value is used at the initial stage of measurement and a larger first comparison value is used at the later stage of measurement. Also, three or more first comparison values may be selectively used. That is, the discharge detection unit can be variously modified as long as it increases or reduces the first comparison value with progress in measurement of an electrical characteristic of a measurement object.

The discharge detection unit according to the fourth embodiment of the present invention may be formed of an analog circuit or a digital circuit. In a case where the discharge detection unit is formed of an analog circuit, a circuit for changing the first comparison value is added to the first part 206 of the discharge detection unit shown in FIG. 11.

Fifth Embodiment

Figure 14:
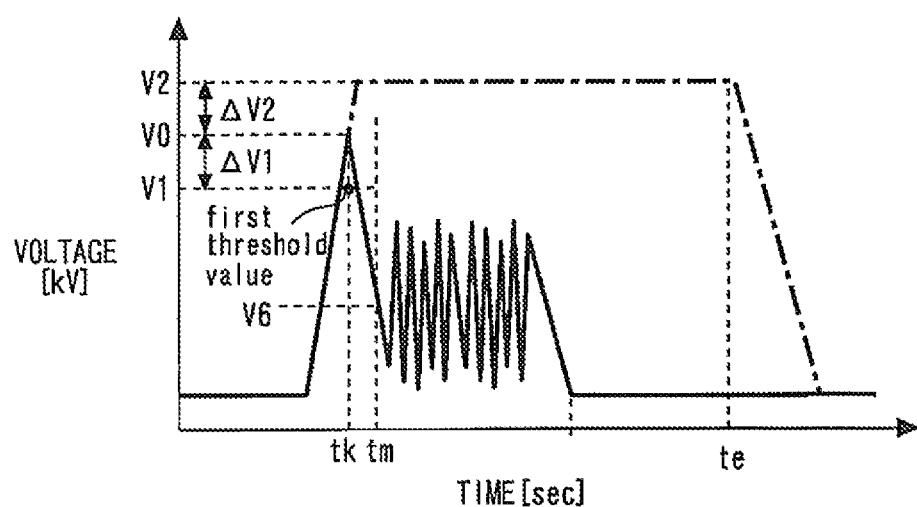
FIG. 14 shows occurrence of electric discharge.

In a fifth embodiment of the present invention, electric discharge or the like at the time of application of a rectangular pulse is detected by using the method of changing the reference value as described in the description of the third embodiment. FIG. 14 shows occurrence of electric discharge before the maximum voltage is reached in an attempt to apply a rectangular pulse to a measurement object.

Such electric discharge is detected by the method in the third embodiment. That is, the discharge alarm is issued when the latest electrical signal value V6 (time tm) becomes smaller than the first threshold value V1 obtained by the immediately preceding sampling (time tk) as a result of electric discharge.

In the second embodiment (FIG. 6), discharge or the like in a voltage increasing process when a rectangular pulse is applied cannot be detected. In the present embodiment, discharge or the like can be detected over the entire rectangular pule application period by using the method of changing the reference value as described in the description the third embodiment. A suitable combination of the features of the embodiments described above may be used.

According to the present invention, electric discharge is detected on the basis of a change in the value of the electrical signal applied to the measurement object. Electric discharge can therefore be detected in a simple way.

Obviously many modifications and variations of the present invention are possible in the light of the above teachings. It is therefore to be understood that within the scope of the appended claims the invention may be practiced otherwise than as specifically described.

What is claimed is:

1. A measuring apparatus comprising:
a measuring unit for measuring an electrical characteristic of a measurement object by applying an electrical signal; and
a discharge detection unit connected to the measuring unit, the discharge detection unit obtaining an electrical signal value that is the value of the electrical signal applied to the measurement object,
wherein the discharge detection unit issues a discharge alarm in response to the outside in response to the electrical signal value being smaller than a predetermined reference value and a difference value between the electrical signal value and the reference value being larger than a predetermined first comparison value after the difference value becomes smaller than the first comparison value,
wherein the reference value is set equal to or larger than the maximum of the electrical signal value when no electric discharge occurs, and
wherein the measurement unit applies the electrical signal to the measurement object so that the electrical signal value is maximized when the measurement of the measurement object is ended.

2. The measuring apparatus according to claim 1, wherein the discharge detection unit issues the discharge alarm to the outside when in response to the electrical signal value being larger than the reference value and the difference value being larger than a predetermined second comparison value.

3. The measuring apparatus according to claim 1, wherein the discharge detection unit has a comparison value storage section in which the first comparison value is stored.

4. The measuring apparatus according to claim 2, wherein the discharge detection unit has a comparison value storage section in which the first comparison value and the second comparison value are stored.

5. The measuring apparatus according to claim 1, further comprising a storage unit connected to the discharge detection unit, the storage unit storing information for identification of the measurement object on which electric discharge has occurred.

6. The measuring apparatus according to claim 1, wherein the measuring unit stops measuring the measurement object when the discharge alarm is issued.

7. The measuring apparatus according to claim 1, wherein the measuring unit applies the electrical signal to the measurement object while monotonously increasing the electrical signal.

8. The measuring apparatus according to claim 1, wherein the measuring unit applies a rectangular pulse as the electrical signal to the measurement object.

9. The measuring apparatus according to claim 1, wherein the electrical signal value is a voltage.

10. A measuring apparatus comprising:
a measuring unit for measuring an electrical characteristic of a measurement object by applying an electrical signal; and
a discharge detection unit connected to the measuring unit, the discharge detection unit obtaining an electrical signal value that is the value of the electrical signal applied to the measurement object,
wherein the discharge detection unit samples the electrical signal value with a predetermined period;
computes a first threshold value determined by subtracting a predetermined first comparison value from the electrical signal value; and
issues a discharge alarm to the outside when the latest electrical signal value becomes smaller than the first threshold value obtained by the immediately preceding sampling, and
wherein the measuring unit applies the electrical signal to the measurement object so that the electrical signal value is maximized when the measurement of the measurement object is ended.

11. The measuring apparatus according to claim 10, wherein the discharge detection unit increases or reduces the first comparison value with progress in measurement of the electrical characteristic of the measurement object.

12. The measuring apparatus according to claim 10, wherein the discharge detection unit has:
a first part that outputs the first threshold value obtained by the immediately preceding sampling;
a second part that outputs the latest electrical signal value; and
a comparator supplied with the output from the first part and the output from the second part.

13. The measuring apparatus according to claim 10, wherein the discharge detection unit is constituted by a digital circuit.

* * * * *